United States Patent
Ahn

(10) Patent No.: US 7,554,879 B2
(45) Date of Patent: Jun. 30, 2009

(54) APPARATUS FOR TESTING A NONVOLATILE MEMORY AND A METHOD THEREOF

(75) Inventor: Jong-Keun Ahn, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/545,670

(22) Filed: Oct. 10, 2006

(65) Prior Publication Data

US 2007/0030755 A1 Feb. 8, 2007

Related U.S. Application Data

(62) Division of application No. 10/996,708, filed on Nov. 24, 2004, now Pat. No. 7,167,411.

(30) Foreign Application Priority Data

Jan. 6, 2004 (KR) .............................. 2004-00604

(51) Int. Cl.
*G11C 11/00* (2006.01)

(52) U.S. Cl. .............................. 365/233.13; 365/189.05
(58) Field of Classification Search ................. 365/233, 365/189.05
See application file for complete search history.

(56) References Cited

U.S. PATENT DOCUMENTS

| 7,213,185 B2 * | 5/2007 | Barone et al. ................ 714/733 |
| 2002/0129195 A1 * | 9/2002 | Hongo et al. ................ 711/104 |
| 2004/0042331 A1 * | 3/2004 | Ikehashi et al. ............. 365/232 |
| 2004/0085814 A1 * | 5/2004 | Kawai et al. ........... 365/185.09 |

* cited by examiner

*Primary Examiner*—Michael T Tran
(74) *Attorney, Agent, or Firm*—F. Chau & Associates, LLC

(57) ABSTRACT

An apparatus for testing or programming a nonvolatile memory in a micro control system and a method thereof is provided. The micro control system comprises: a nonvolatile memory for storing data; an address register for storing an address; a data register for storing serial data; control logic for controlling the nonvolatile memory, the address register and the data register; a clock pin for receiving a clock; a data pin for receiving serial data synchronized with the clock; and a timer for measuring time.

9 Claims, 6 Drawing Sheets

APPARATUS FOR TESTING A NONVOLATILE MEMORY AND A METHOD THEREOF

CROSS-REFERENCE TO RELATED APPLICATION

The application is a divisional application of U.S. patent application Ser. No. 10/996,708, filed on Nov. 24, 2004 now U.S. Pat. No. 7,167,411 which claims priority to Korean Patent Application No. 2004-0000604, filed on Jan. 6, 2004.

FIELD OF THE INVENTION

The present invention relates to semiconductor integrated circuit devices, and specifically, to an apparatus for testing or programming a nonvolatile memory in a micro control system and a method thereof.

BACKGROUND

In general, there are two methods for testing nonvolatile memories embedded in micro control systems. One involves testing nonvolatile memories using a parallel interface, and the other involves testing nonvolatile memories using a serial interface.

When testing nonvolatile memories using a parallel interface, an independent memory chip of a nonvolatile memory can be controlled employing addresses, data and control signals. However, due to many connection signals, such control systems have been difficult to design. In addition, because many channels are used when testing products, there is a limit as to how many chips can be tested simultaneously. Furthermore, as memory size increases, additional address pins are required.

When testing nonvolatile memories using a serial interface, additional pins do not have to be added because the size of internal serial buffers can be controlled even when memory size varies. An example of an apparatus for testing nonvolatile memories employing a serial interface and method thereof are disclosed in Korean Laid-Open Publication No. 2002-0080907.

FIG. 1 shows a micro control system having a conventional memory controller. Referring to FIG. 1, the micro control system having the conventional memory controller comprises a nonvolatile memory 10 and a memory controller 20. The nonvolatile memory 10 includes a row and column decoder block (X-DEC & Y-DEC) 12, an electronically erasable programmable read only memory (EEPROM) cell array 14, a high-voltage generator 16 and a write buffer 18. The memory controller 20 includes control logic 21, a data register 22 and an address register 23. A clock SCLK and serial data SDAT are inputted through a clock pin 32 and a data pin 31 from an external test system (not shown).

FIG. 2 is a timing diagram illustrating a method of programming the nonvolatile memory 10 of the micro control system in FIG. 1 using a serial interface mode. The clock SCLK and the serial data SDAT are inputted through the clock pin 32 and the data pin 31. The serial data SDAT has a command, address and program data. FIG. 2 shows that the time required to program one data bit is 30.

The time, however, for programming data is controlled by counting a clock applied from the outside in a conventional programming method. Therefore, when a cycle of an external clock is changed, a program time is also changed. In addition, because various products have different program and erase times according to certain processes, applying the external clock in certain products may result in the cycle of the external clock being out of synch with programming/erasing methods.

SUMMARY OF THE INVENTION

According to one aspect of the present invention, a micro control system comprises: a nonvolatile memory for storing data; an address register for storing an address; a data register for storing serial data; control logic for controlling the nonvolatile memory, the address register and the data register; a clock pin for receiving a first clock; a data pin for receiving serial data synchronized with the first clock; and a timer for measuring time.

In a preferred embodiment, the control logic transmits data in the data register to a write buffer of the nonvolatile memory, activates a program enable signal to perform a program operation with respect to the serial data, and controls an activation time of the program enable signal using the timer. The timer comprises an oscillator for generating a second clock and a counter for counting the second clock.

In another preferred embodiment, the micro control system further includes a selection pin for determining whether the first clock and serial data are inputted from the clock pin and the data pin. The selection pin resets logic circuits for controlling the first clock and serial data inputted from the clock pin and the data pin. The control logic activates an erase enable signal for erasing data in memory cells of the nonvolatile memory and controls an activation time of the erase enable signal using the timer.

In yet another preferred embodiment, the nonvolatile memory comprises: an electronically erasable programmable read only memory (EEPROM) comprising memory cells; a decoder for selecting memory cells from the EEPROM in response to an address provided from the address register; a voltage generator for generating a voltage to perform an operation in the nonvolatile memory in response to the control logic; and a write buffer for receiving data bits from the data register and for programming data bits to the EEPROM in response to the control logic. The address, serial data, and first clock are received from an external device.

According to another aspect of the present invention, a micro control system comprises: a nonvolatile memory for storing data; an address register for storing an address; a test register for storing test data; a data register for storing serial data; control logic for controlling the nonvolatile memory, the address register and the data register; a clock pin for receiving a first clock; and a data pin for receiving serial data synchronized with the first clock.

In a preferred embodiment, the control logic determines whether data inputted through the data pin is test data, wherein if the inputted data is test data, the control logic stores the inputted data in the test register, wherein the test register supplies test data inputted to the test register to the nonvolatile memory according to a control signal applied from the control logic.

In another preferred embodiment, the micro control system further comprises: a selection pin for selecting whether the first clock and serial data from the clock pin and the data pin are inputted, wherein the selection pin resets logic circuits for controlling the first clock and serial data inputted from the clock pin and the data pin. The nonvolatile memory comprises: an EEPROM comprising memory cells; a decoder for selecting memory cells from the EEPROM in response to an address provided from the address register; a voltage generator for generating a voltage to perform an operation in the nonvolatile memory in response to the control logic; and a write buffer for receiving data bits from the data register and for programming data bits to the EEPROM in response to the control logic. The address, test data, serial data, and first clock are received from an external device.

According to another aspect of the present invention, a method for erasing a nonvolatile memory in a micro control system including a memory cell array and a control logic comprises: receiving an erase command and address data to be erased by synchronizing a clock having a first frequency; applying a voltage for an erase operation; activating an erase enable signal for erasing a memory cell from the memory cell array in response to the control logic; maintaining the clock in one of a high and low level during a period from one of a rising edge and falling edge of the clock used to activate the erase enable signal; and restoring the clock to the first frequency after maintaining the clock in one of the high and low levels and inactivating the erase enable signal.

In yet another aspect of the present invention, a method for erasing a nonvolatile memory in a micro control system including a memory cell array and a control logic comprises: receiving information with respect to a test type, wherein the information is synchronized with an external clock; and testing the nonvolatile memory according to the information, wherein the clock maintains the same level during a predetermined period in a test period. When testing the nonvolatile memory, a pre-set voltage is applied to the nonvolatile memory for maintaining the nonvolatile memory in one of a program, read, and erase state.

DETAILED DESCRIPTION OF THE INVENTION

A transfer protocol for programming a nonvolatile memory embedded in systems employing a clock signal and a data signal, or a sender/receiver data signal may be used by a micro control system (or "a micro controller") according to the present invention. In accordance with the transfer protocol, a data register (or "a serial buffer") having a size larger than or the same as that of a write buffer in the nonvolatile memory (e.g., 1 Byte through 4 Bytes) is used, and data bits (e.g., 1 Byte through 4 Bytes) required to update storage information are sequentially transferred to the data register from the outside. The transferred data bits are loaded to the write buffer in the nonvolatile memory, and then the loaded data bits are programmed to an array of the nonvolatile memory. While the data bits are programmed, data bits to be programmed next are sequentially transferred to the data register from the outside. Because transferring data and program operations are performed simultaneously, data is programmed without large a buffer and in a short amount of time.

Figure 1:
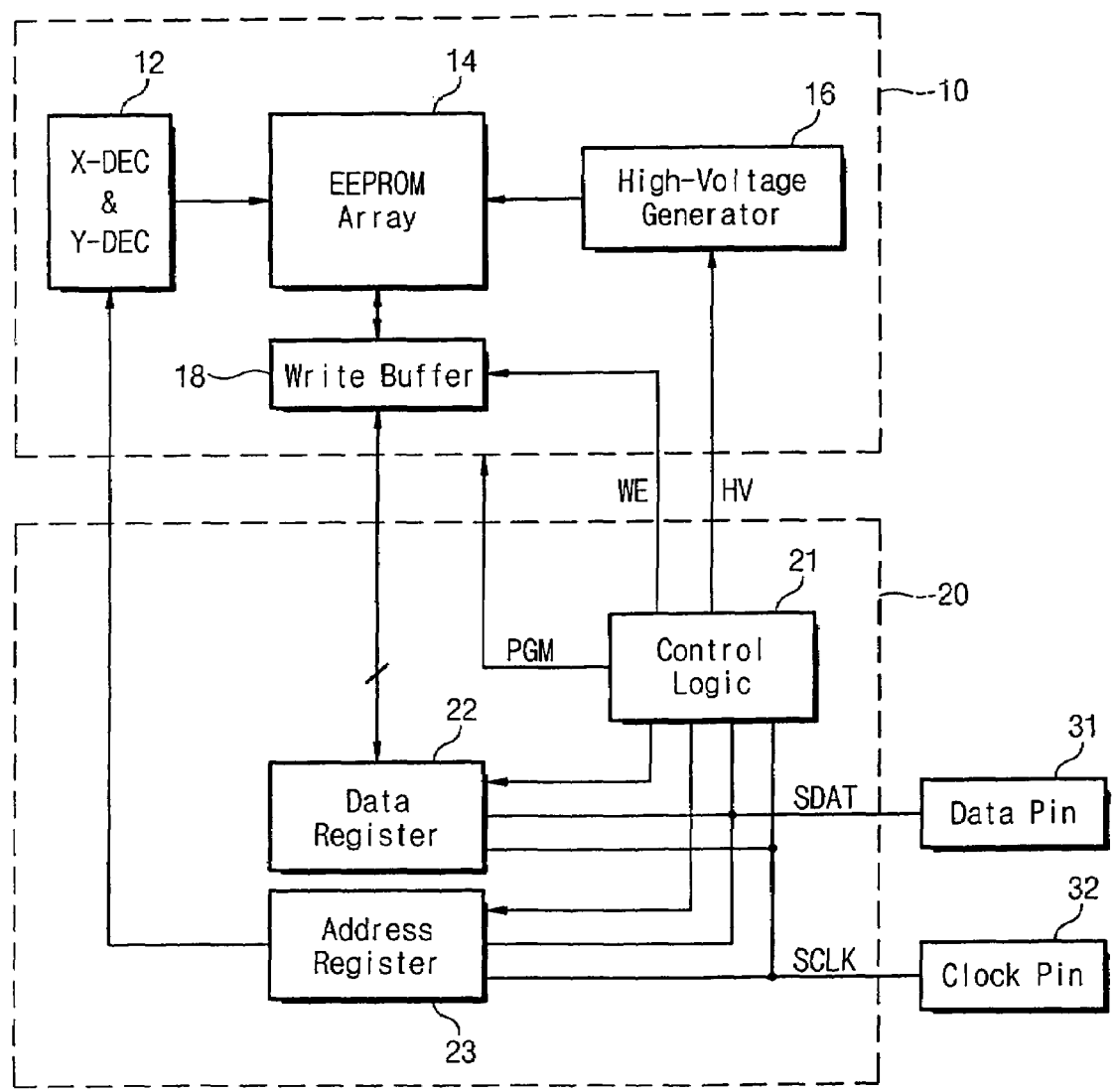
FIG. 1 shows a micro control system having a conventional memory controller.
Figure 2:
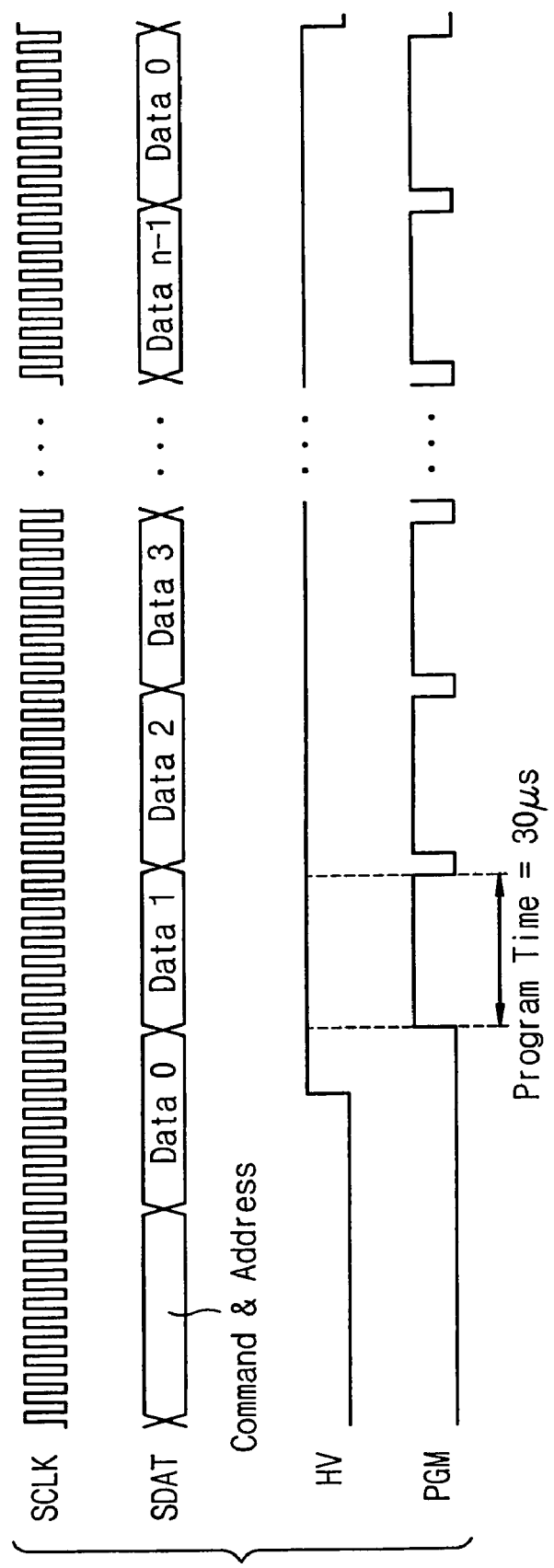
FIG. 2 is a timing diagram illustrating a method of programming a nonvolatile memory of the micro control system in FIG. 1 using a serial interface mode.
Figure 3:
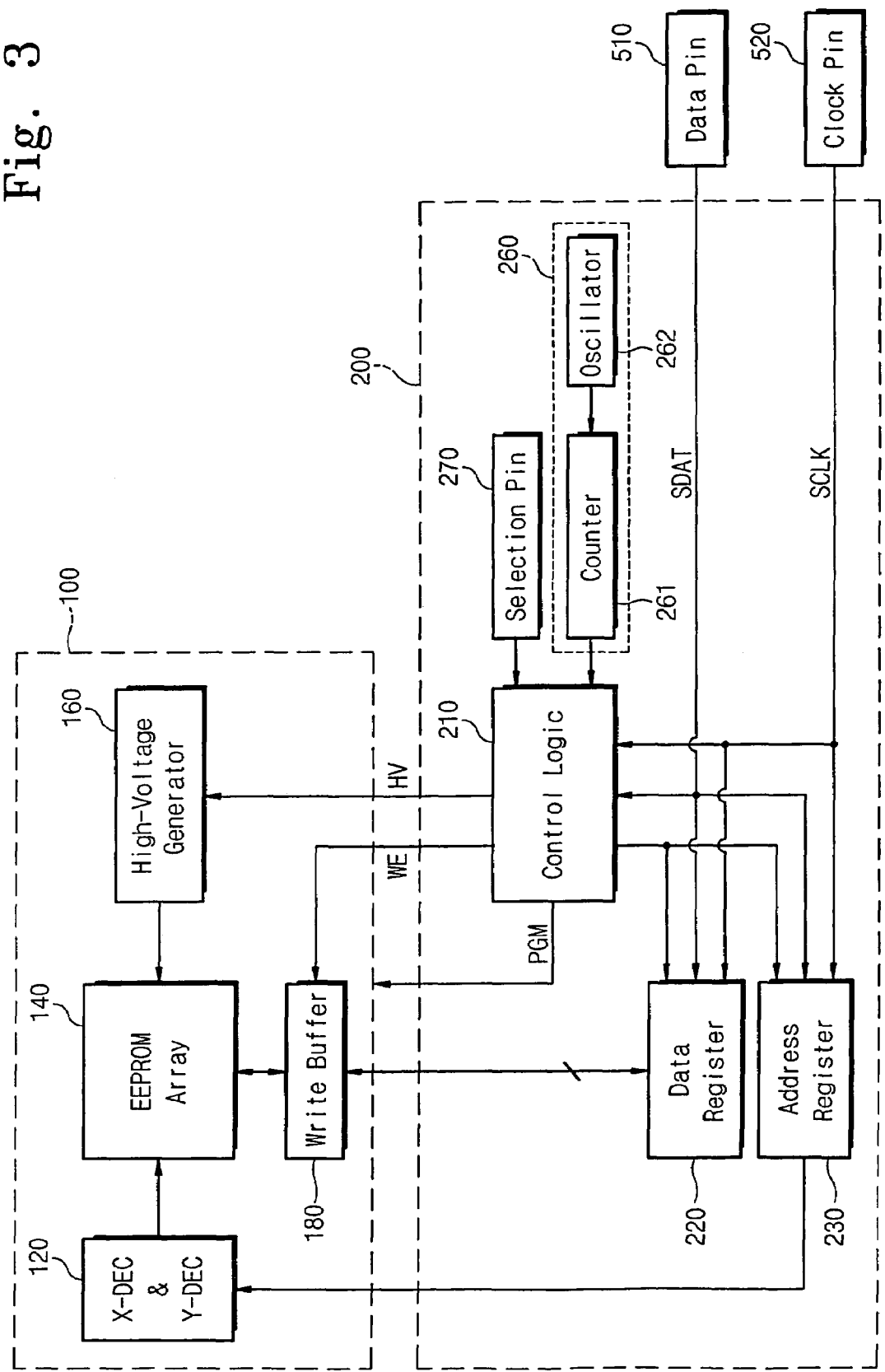
FIG. 3 shows a micro control system having a memory controller according to a first exemplary embodiment of the present invention.

FIG. 3 shows a micro control system having a memory controller according to a first exemplary embodiment of the present invention. Referring to FIG. 3, a nonvolatile memory 100 can be electrically erased and programmed. Erase/program/read operations of the nonvolatile memory 100 are controlled by a memory controller 200. The nonvolatile memory 100 includes a row and column decoder block (X-DEC & Y-DEC) 120, an electronically erasable programmable read only memory (EEPROM) cell array 140, a high-voltage generator 160 and a write buffer 180. The EEPROM cell array 140 has memory cells arranged in columns (or "word lines") and rows (or "bit lines") and can be electrically erased and programmed. In addition, the row and column decoder block 120 selects a row and column of the EEPROM cell array 140 according to an address provided from the memory controller 200. The high-voltage generator 160 generates a voltage required to perform operations such as program/erase/read according to control of the memory controller 200. Data provided from the memory controller 200 that is to be programmed is loaded depending on a control signal WE.

Still referring to FIG. 3, the memory controller 200 temporarily stores serial data bits sequentially provided from the outside according to a serial interface mode. The stored data bits are transferred to the write buffer 180 of the nonvolatile memory 100. The memory controller 200 generates an address required to program data bits as well as control signals. In addition, the memory controller 200 includes control logic 210, a data register 220, an address register 230, a selection pin 270, and a timer 260 comprising a counter 261 and an oscillator 262.

The control logic 210 is connected to a data pin 510 and a clock pin 520. The data pin 510 receives a command, address and data, and the clock pin 520 receives a clock signal SCLK. The clock and data inputted to the data pin 510 and the clock pin 520 are inputted from a test system.

If a program operation for updating information of the nonvolatile memory 100 starts, the control logic 210 controls the data register 220 and the address register 230 such that data and address information applied to the data pin 510 becomes synchronized with the clock signal SCLK to be stored in the data register 220 and the address register 230. The control logic 210 generates control signals PGM, WE and HV for controlling the nonvolatile memory 100. The control signal WE loads data bits stored in the data register 220 to the write buffer 180. The control signal PGM (or "program enable signal") shows a section where data bits loaded to the write buffer 180 are programmed to the EEPROM cell array 140. The control signal HV activates the high-voltage generator 160 to generate a high voltage necessary for the program operation.

The data register 220 synchronizes serial data bits sequentially applied to the data pin 510 under control of the control logic 210 to the clock signal SCLK and then temporarily stores them. The address register 230 synchronizes address bits sequentially applied to the clock pin 520 under control of the control logic 210 and then stores them.

The timer 260 comprises the oscillator 262 and the counter 261. The oscillator 262 generates a clock and counts the clock in the counter 261. The timer 260 is controlled by the control logic 210 and is used to control program time or erase tine internally.

The selection pin 270 selects whether the nonvolatile memory 100 is programmed or tested externally by employing the serial interface mode. In other words, the selection pin 270 selects whether the nonvolatile memory 100 is programmed or tested externally employing serial interface mode, or if it is being used in an internal operation of the micro control system. When the nonvolatile memory 100 is used in the internal operation of the micro control system, the selection pin 270 resets circuits and registers, which are used to support the serial interface mode.

If a program operation starts, a command and an address are sequentially applied to the data pin 510 from the outside. The control logic 210 receives and interprets a command applied to the data pin 510. Address bits applied to the data pin 510 become synchronized with the clock signal SCLK so that they are sequentially stored in the address register 230. Data to be applied next (hereinafter referred to as "first program data") is transferred to the data register 220 under control of the control logic 210.

That is, the control logic 210 activates a control signal HV such that the high-voltage generator 160 generates a high voltage necessary for a program operation before data bits of 1 Byte, that is, all of the first program data are transmitted to the data register 220. The control logic 210 detects a start bit and a stop bit of the serial data SDAT, which is applied to the data pin 510. If the stop bit is detected, the control logic 210 loads the first program data bits of the data register 220 to the write buffer 180 and transfers an address of the address register 230 to the row and column decoder block 120. At the same time, the control logic 210 activates the control signal PGM. As a result, a program operation is performed during a predetermined time (e.g., 30) (hereinafter referred to as "program time") in a known manner.

The program time is controlled in the memory controller 200 employing the timer 260 and the control logic 210. The control logic 210 stores the previously set program time. Additionally, if a program starts, the control logic 210 makes the counter 261 count a clock generated from the oscillator 262. As a result, the control logic 210 controls the program time such that a program operation is performed during only the previously set program time.

Figure 4:
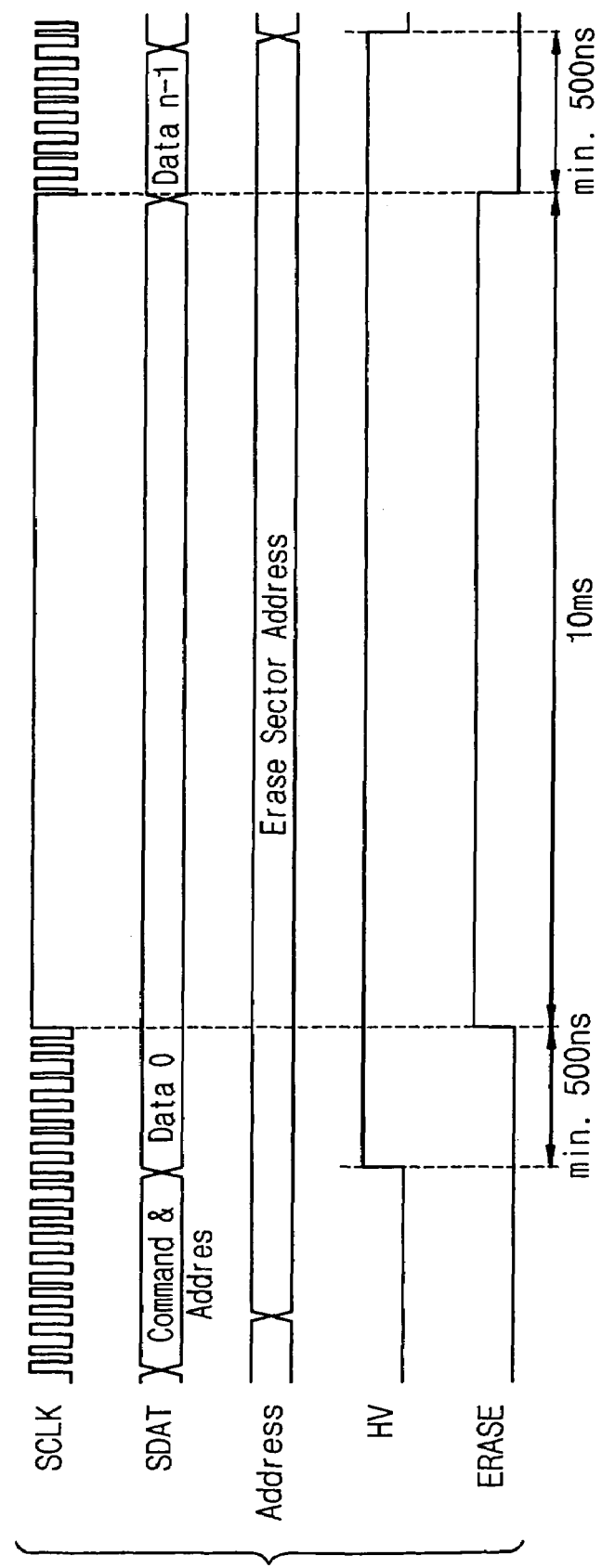
FIG. 4 is a timing diagram illustrating an erase operation according to the first exemplary embodiment of the present invention.

Typical examples of an erase operation are a sector erase and a chip erase. In the sector erase, an erase operation is performed with respect to a portion of the cells of nonvolatile memories. In the chip erase, an erase operation is performed with respect to entire cells of nonvolatile memories while ignoring an erase start address. An erase operation will be described referring to the sector erase with reference to a timing diagram shown in FIG. 4.

If an erase operation starts, a command and an address are sequentially applied to the data pin 510. The control logic 210 receives and interprets the command applied to the data pin 510. The high-voltage generator 160 activates the control signal HV to generate a high voltage necessary for the erase operation. The control logic 210 activates the control signal HV and then activates a control signal ERASE. As a result, an erase operation is performed during a predetermined time (e.g., 10 ms) (hereinafter referred to as "erase time") in a known manner.

The erase time is controlled in the memory controller 200 employing the timer 260 and the control logic 210. The control logic 210 stores the previously set erase time. Additionally, if an erase operation starts, the control logic 210 makes the counter 261 count a clock generated from the oscillator 262. As a result, the control logic 210 controls the erase time such that an erase operation is performed during only the previously set erase time.

Figure 5:
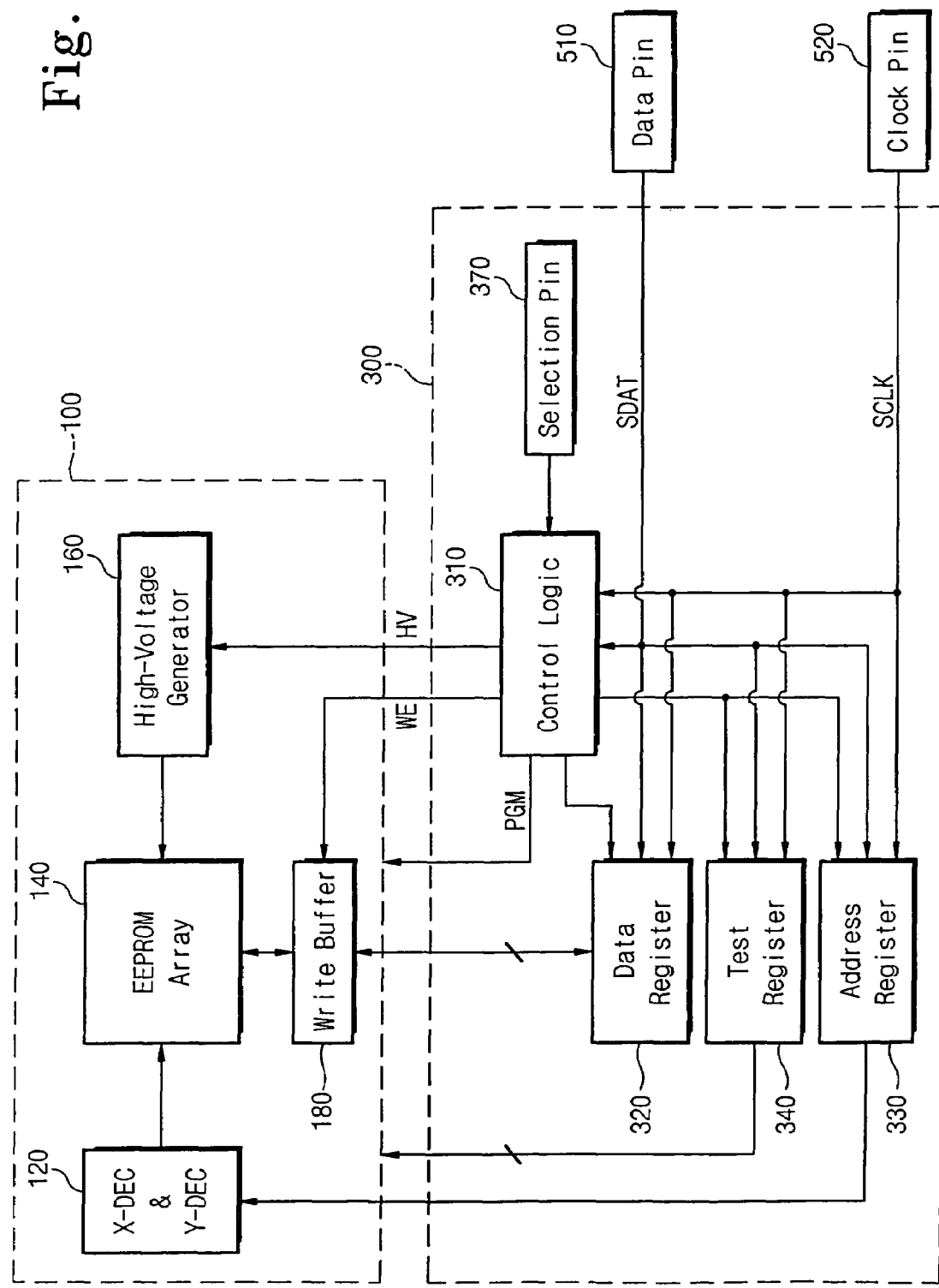
FIG. 5 shows a memory controller according to a second exemplary embodiment of the present invention.

FIG. 5 shows a memory controller 300 according to a second exemplary embodiment of the present invention. The memory controller 300 is similar to the memory controller 200 in FIG. 3 except that the timer 260 is excluded, and a test register 340 is added.

As shown in FIG. 5, the test register 340 synchronizes data bits sequentially applied to the data pin 510 with the clock signal SCLK and then temporarily stores them. Control logic 310 determines whether data inputted to the data pin 510 is a test register set command. In this case, the test register set command has data bits including information about a test type and whether data bits inputted through the data pin 510 are to perform a function of testing memories. In addition, the control logic 310 stores data bits in the test register 340 if the data inputted to the data pin 510 is the test register set command. In this embodiment, data bits stored in the test register 340 comprise data bits of 16 bits.

As there are various types of tests performed in nonvolatile memories, bit values of the test register set command, that is, the values of data bits stored in the test register 340 are changed depending on the test type. In other words, all data bits have a "1" logic level value in, for example, a current measuring test of a main memory cell.

Figure 6:
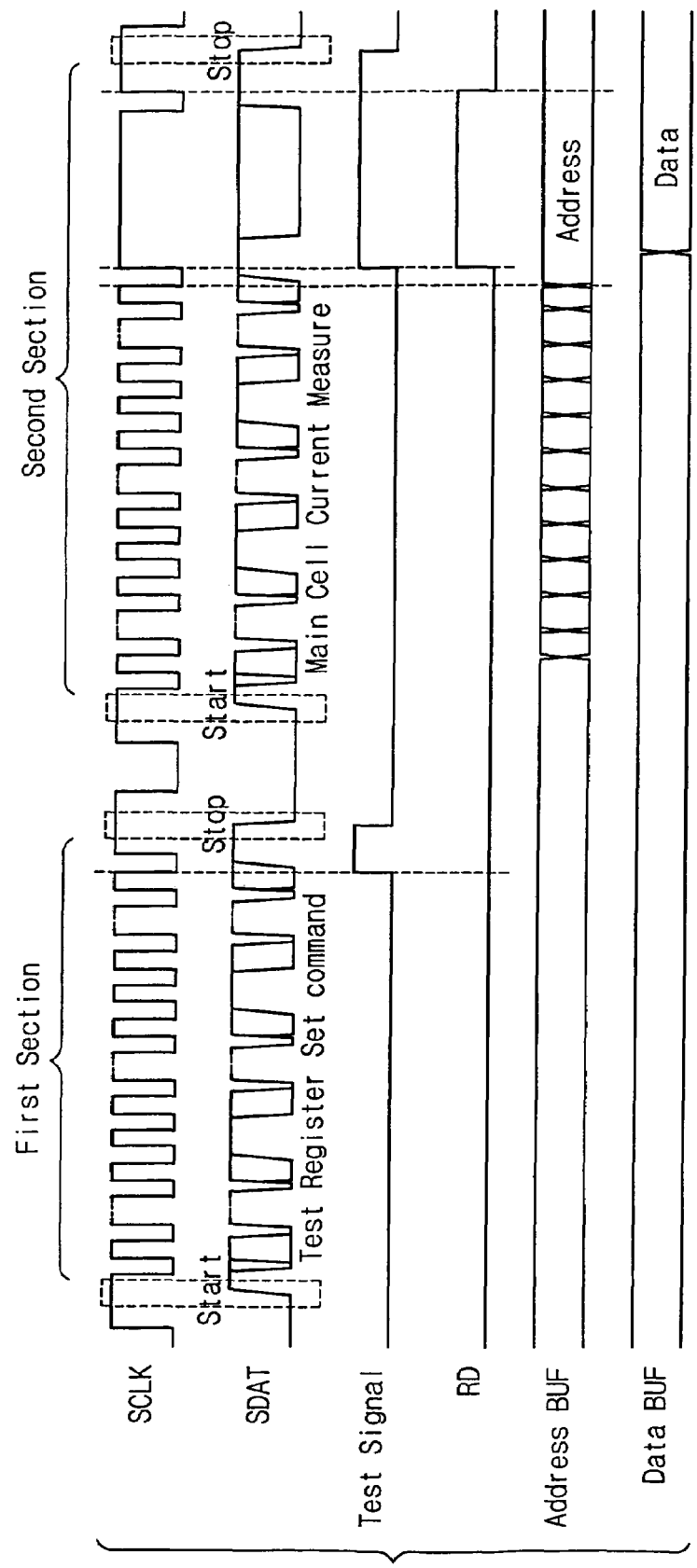
FIG. 6 is a timing diagram a test operation of a nonvolatile memory according to the second exemplary embodiment of the present invention.

FIG. 6 illustrates a test operation of the nonvolatile memory 100 according to the second exemplary embodiment of the present invention.

As shown in FIG. 6, while the clock SCLK maintains a high level, start/stop conditions are materialized as the logic level of data SDAT is changed. After materializing the start condition, the data SDAT becomes synchronized with the clock SCLK to be inputted. As previously mentioned, a test register set command being inputted in a first section has information showing that data inputted through the present data pin, for example, the data pin 510, is the test register set command, and information with respect to the type of test to be performed after inputting the test register set command.

FIG. 6 also shows a current measuring test of a main cell. If the test register set command is inputted in a first section, the control logic 310 stores test register bits corresponding to the current measuring test of the main cell in the test register 340. The test register 340 then outputs stored information to the nonvolatile memory 100.

If the start condition is materialized again, data is inputted to a second section. The current measuring test of the main cell with respect to the nonvolatile memory 100 is initialized according to the current measuring test of the main cell inputted through the data pin 510 in the second section.

In particular, a clock is not toggled and maintains the same level in the second section during a predetermined period. The reason for this is to sufficiently test the reliability of the nonvolatile memory 100 in program, erase and read operations. As shown in FIG. 6, a test signal becomes transitioned to a high level when the clock is not toggled and maintains the same level. As a result, a control signal RD is transitioned to a high level. When the control signal RD is transitioned to the high level and maintains the high level, a regular stress is applied to the nonvolatile memory 100. That is, a voltage previously set for testing is continuously applied during a regular period for maintaining the clock in a read, program or erase state.

According to the present invention, because program time and erase time are controlled using an internal timer, regular program and erase times may continuously occur irrespective of a variation of an external clock. Furthermore, various tests to the nonvolatile memory embedded in the micro control system can take place using a serial interface mode.

The invention has been described using exemplary preferred embodiments. However, it is to be understood that the scope of the invention is not limited to the disclosed embodi-

What is claimed is:

1. A micro control system comprising:
a nonvolatile memory for storing data;
an address register for storing an address;
a data register for storing serial data;
a clock signal line for receiving a first clock;
a data signal line for receiving serial data including command data synchronized with the first clock;
a control logic for receiving the command data from the data signal line and controlling the nonvolatile memory, the address register and the data register; and
a timer for measuring time for programming and erasing the nonvolatile memory,
wherein the receiving of the command data, the address or the data starts or stops according to a logic level of the serial data at an edge of the first clock.

2. The micro control system of claim 1, wherein the serial data from the data signal line is received synchronized with the first clock during the programming or erasing of the nonvolatile memory.

3. The micro control system of claim 1, wherein the receiving of the command data, the address or the data starts or stops according to a start bit and a stop bit of the serial data.

4. The micro control system of claim 1, wherein the nonvolatile memory comprises:
an address decoder decoding the address stored in the address register;
a write buffer receiving data from the data register; and
a high voltage generator generating a configured high voltage for a program, erase or test operation.

5. The micro control system of claim 4, wherein the data buffer is larger than or the same as that of the write buffer in the nonvolatile memory.

6. A micro control system comprising;
a nonvolatile memory for storing data;
an address register for storing an address;
a data register for storing serial data;
a clock signal line for receiving a first clock;
a data signal line for receiving serial data including command data synchronized with the first clock;
a control logic for receiving the command data from the data signal line and controlling the nonvolatile memory, the address register and the data register; and
a timer for measuring time for programming and erasing the nonvolatile memory, wherein the timer comprises:
an oscillator for generating a second clock; and
a counter for counting the second clock, and
wherein the program or erase time of the nonvolatile memory is determined according to the second clock, while the receiving time of the serial data is determined according to the first dock.

7. The micro control system of claim 6, wherein a transfer rate of the serial data is determined by a frequency of the first clock, while the time for programming or erasing the nonvolatile memory is determined by a frequency of the second clock.

8. A method for measuring current of a main cell of a nonvolatile memory in a micro control system including a memory cell array and a control logic comprising:
receiving a command for measuring current of a main cell and an address data to be measured by synchronizing a clock having a first frequency;
applying a voltage for measuring current of the main cell selected by the address data;
maintaining the clock in a high level or a low level during a predetermined period for measuring current of the main cell; and
restoring the clock to the first frequency after maintaining the clock in one of the high and low levels.

9. A micro control system comprising:
a nonvolatile memory for storing data;
an address register for storing an address;
a data register for storing serial data;
control logic for controlling the nonvolatile memory, the address register and the data register;
a clock signal line for receiving a first clock;
a data signal line for receiving serial data synchronized with the first clock; and
a timer for measuring time,
wherein the control logic transmits data in the data register to a write buffer of the nonvolatile memory, activates a program enable signal to perform a program operation with respect to the serial data, and controls an activation time of the program enable signal using the timer.

* * * * *